(12) United States Patent
Bi et al.

(10) Patent No.: US 12,007,422 B1
(45) Date of Patent: Jun. 11, 2024

(54) METHOD AND SYSTEM FOR ALLOCATING OPTIMAL INERTIA IN A POWER SYSTEM

(71) Applicant: NORTH CHINA ELECTRIC POWER UNIVERSITY, Beijing (CN)

(72) Inventors: Tianshu Bi, Beijing (CN); Cheng Wang, Beijing (CN); Jiahao Liu, Beijing (CN); Guoyi Xu, Beijing (CN)

(73) Assignee: NORTH CHINA ELECTRIC POWER UNIVERSITY, Beijing (CN)

( * ) Notice: Subject to any disclaimer, the term of this patent is extended or adjusted under 35 U.S.C. 154(b) by 0 days.

(21) Appl. No.: 18/410,614

(22) Filed: Jan. 11, 2024

Related U.S. Application Data

(63) Continuation of application No. 18/207,508, filed on Jun. 8, 2023.

(51) Int. Cl.
*G01R 21/133* (2006.01)
*G01R 19/25* (2006.01)
*G01R 31/08* (2020.01)

(52) U.S. Cl.
CPC ..... *G01R 21/1331* (2013.01); *G01R 19/2513* (2013.01); *G01R 31/088* (2013.01)

(58) Field of Classification Search
None
See application file for complete search history.

(56) References Cited

U.S. PATENT DOCUMENTS

| | | | | |
|---|---|---|---|---|
| 2014/0361540 A1* | 12/2014 | Knight | ............... | H02K 7/183 290/44 |
| 2015/0360552 A1* | 12/2015 | Chung | ............... | B60K 6/365 180/65.235 |

\* cited by examiner

*Primary Examiner* — Shelby A Turner
*Assistant Examiner* — Brandon J Becker
(74) *Attorney, Agent, or Firm* — Hunton Andrews Kurth LLP

(57) ABSTRACT

Online estimation of area-level inertia can be used for frequency stability control in low-inertia power systems. This disclosure provides an area-level inertia online estimation method considering inter-area equivalent frequency dynamics. The disclosed method only needs one phasor measurement unit placed at any bus within each area. The inter-area equivalent frequency dynamics model for the multi-area power system is developed, which is employed to estimate area-level inertia under the small disturbance situation. Then, the area-level inertia estimation model boils down to a nonlinear parameter identification problem. The other boundary conditions of the disclosed method are derived by parameter identifiability.

1 Claim, 13 Drawing Sheets

METHOD AND SYSTEM FOR ALLOCATING OPTIMAL INERTIA IN A POWER SYSTEM

BACKGROUND

Inertia is an important indicator for power system frequency stability. Unlike synchronous generators, the power electronics interfaced renewable power generation (RPG) does not come with an inertial response. With the large-scale penetration of RPG, especially offshore wind farms and large-scale wind-solar hybrid renewable energy systems, the power system inertia level has been rapidly decreasing.

SUMMARY

Online estimation of area-level inertia can be used for frequency stability control in low-inertia power systems. This disclosure provides an area-level inertia online estimation method considering inter-area equivalent frequency dynamics. Some methods require monitoring the frequency and active power of all the boundary buses and tie-lines, while the disclosed method only needs one phasor measurement unit (PMU) placed at any bus within each area. The inter-area equivalent frequency dynamics model for the multi-area power system is developed, which is employed to estimate area-level inertia under the small disturbance situation. Then, the area-level inertia estimation model boils down to a nonlinear parameter identification problem. The other boundary conditions of the disclosed method are derived by parameter identifiability. Simulation results carried out on the modified IEEE 39-bus system show that the disclosed method can accurately estimate the area-level inertia using the bus frequency measurement. The disclosed method is also effective under different PMU placements, time-varying virtual inertia, different system partitioning, and system partitioning variation conditions.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
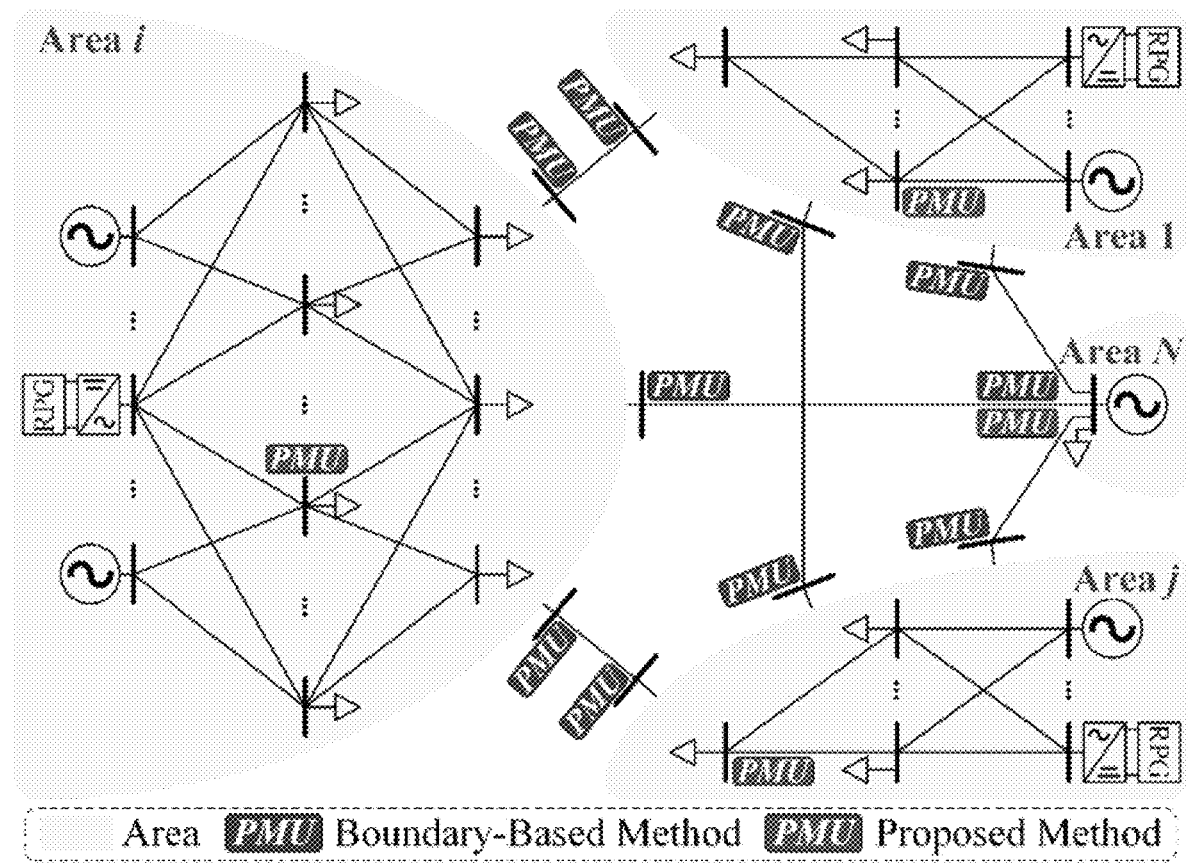
FIG. 1 illustrates an exemplary multi-area power system installed with PMUs.

Exemplary embodiments of the invention will now be described in order to illustrate various features of the invention. The embodiments described herein are not intended to be limiting as to the scope of the invention, but rather are intended to provide examples of the components, use, and operation of the invention.

I. Introduction

The frequency of low-inertia power system is difficult to maintain. During the post-disturbance frequency dynamics, two critical indexes, i.e., the rate of change of frequency (RoCoF) and frequency deviation, may cross the allowable limits as the inertia decreases. The RoCoF leads the RPG to be tripped by the islanding relays, causing a continuous frequency dropping event. The frequency deviation could trigger under-frequency load shedding (UFLS), causing power system blackout. Thus, the online estimation of inertia for low-inertia power systems is crucial, whose result could serve as an early-warning sign and be adopted to update online energy control schemes. Thanks to the development and deployment of phasor measurement units (PMUs), power system state variables could be monitored in a real-time and synchronous manner, which provides the basis for online inertia estimation.

The system-level inertia estimation, i.e., estimating the total inertia of one power system as a whole, has been widely studied. Since all the generators are aggregated to an equivalent generator and its dynamics is embodied by the aggregated swing equation in the center of inertia (COI) coordinate, the total disturbed active power and COI frequency should be provided for the online inertia estimation. For example, early works show high estimation accuracy could be obtained by simply calculating the ratio of the two variables above. Considering the field scenarios, the COI frequency can be given by the average frequency measured by several PMUs at different locations or the frequency measured by a certain PMU. The value of disturbed active power can be obtained in three ways: 1) using the recorded large disturbance; 2) creating disturbance artificially using the high voltage direct current transmission (HVDC) and battery energy storage; 3) calculating the generator total active power variation via the data recorded by PMUs placed at the terminals of all the generators.

In practice, the aforementioned system-level inertia estimation methods may not work as the disturbed power could be hard to obtain, e.g., insatiable operating conditions and insufficient PMU placements. In some instances, due to large-scale RPG penetration and long inter-area transmission lines, the inertia of low-inertia power systems differs spatially on the area scale, giving rise to low-inertia areas. In general, the system total inertia can only reflect the system average frequency. Even if the total inertia is sufficient, the post-disturbance frequency of low-inertia areas could still be instable, leading to the frequency cascading collapse of the whole power system.

In such circumstance, area-level inertia estimation methods have been drawing more attention. According to the area COI swing equation, the area total disturbed active power and area COI frequency should be known. Unlike the system-level estimation, the area disturbed power can be represented by the total exchange power though all the inter-area lines, which can be measured by the PMUs placed at all the area boundary buses. The area inertia is estimated based on the area COI swing equation and the parameter identification method. It should be noted the estimated inertia would be larger than the total synchronous inertia when considering the RPG virtual inertia (VI), and is defined as effective inertia. As a supplement, some approximate area COI frequency using the PMU optimal placement methods based on Pearson correlation and graph centering.

The area-level inertia estimation can also be performed from the perspective of power system equivalent dynamics. The area complex dynamics besides the swing equation are considered, and the area equivalent parameters, including the area inertia, are estimated by area boundary PMU measurement. The electromagnetic equation and swing equation of the equivalent generator are considered. Based on all electrical quantities measured at the area boundary, such as the exchange active power and bus voltage phasor, the Kalman filter is established to estimate the area inertia and other parameters. Considering the electrical topology within the area, more detailed area equivalent dynamics and area inertia calculation methods are considered by some.

Although area-level inertia estimation is more practical, existing methods highly depend on measuring the inter-area exchange power. Once one PMU at the area boundary has data quality issue, the inter-area exchange power cannot be obtained accurately, and the estimation result would be inaccurate. Moreover, the placed PMUs may not be able to monitor all the inter-area lines for a large power system with multiple areas and complex topology.

This disclosure provides exemplary embodiments to estimate the area-level inertia online without the requirement of placing PMUs at all the area boundary buses. In fact, the underlying reason for such requirement is regarding the area-level power system as an independent entity while the interconnection among different area-level power system is neglected. Thus, the inter-area equivalent frequency dynamics for inertia online estimation is described in this disclosure.

Exemplary salient features of this disclosure are threefold.
(1) The frequency dynamics model of the multi-area system considering the inter-area equivalent frequency dynamics is descried, and the mathematical model for area-level inertia online estimation is established accordingly. Besides the aggregated swing equation of each area, the power flow equation of the equivalent inter-area line is introduced to relax the boundary active power measurement requirement. In the disclosed method, only one PMU, whose location could be arbitrarily selected, is needed for each area.
(2) The area-level inertia estimation constitutes a parameter identification problem in a nonlinear form. After parameter identifiability analysis, the area-level inertia can be estimated using the PMU-measured frequency of the arbitrarily selected PMU of each area and the power flow information from SCADA/EMS. The particle swarm optimization (PSO)-based method is described to identify the inertia parameters.
(3) The disclosed method is capable of tracking the time-varying VI of PRG and adaptive to different system partitioning conditions. The area equivalent internal reactance and the equivalent inter-area line reactance, which can be used for power system dynamics analysis and control, can be estimated along with the area-level inertia. The estimated inter-area line reactance reflects the electrical distance between PMUs and can be used to monitor the system partitioning variation.

II. Role of Area-Level Inertia

FIG. 1 illustrates an exemplary multi-area power system installed with PMUs. A generic multi-area power system, which has been partitioned, is shown in FIG. 1. The set of areas is denoted as N (Card(N)=N). The areas are interconnected by the inter-area lines. The RPGs could work at either the virtual synchronous generator (VSG)-based VI control mode or the MPPT mode. While in the former, the frequency dynamics of RPG is the same as the synchronous generator, and in the latter, the RPG can be considered as the constant power load.

The areas 1, ..., i, j, ..., (N−1) contain multiple generators, including synchronous generators and RPGs. In these areas, the internal topology is drawn in a simplified manner, while their boundary buses are shown in detail, e.g., the 3 boundary buses for area i. In particular, the N-th area corresponds to only one generator, representing either the dominant generator which has a larger capacity or the external grid.

Figure 2:
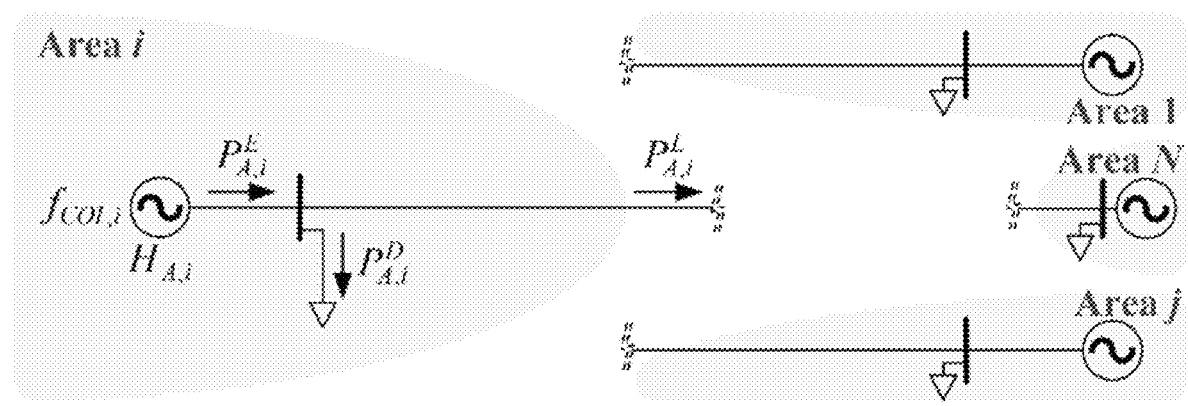
FIG. 2. Shows an exemplary area-level inertia equivalent model using the boundary-based method.

The generators in each area can be equivalent to an aggregated generator from the area COI perspective. FIG. 2. Shows an exemplary area-level inertia equivalent model using the boundary-based method. For the existing boundary-based methods, which require PMUs placed at all the area boundary buses, the area-level equivalent model is shown in FIG. 2. Taking the i-th area as an example, the COI swing equation can be given as follows:

$$2H_{A,i} \frac{df_{COI,i}}{dt} = P_{A,i}^M - P_{A,i}^E \quad (1)$$
$$= P_{A,i}^M - (P_{A,i}^D + P_{A,i}^L),$$

where $P_{A,i}^M$ and $P_{A,i}^E$ are the total mechanical power and electromagnetic power of all the generators in i-th area, respectively; $P_{A,i}^D$ and $P_{A,i}^L$ are the total active powers of all loads and all inter-area lines connected at i-th area, respectively, and the MPPT-controlled RPGs are included in $P_{A,i}^D$; $f_{COI,i}$ and $H_{A,i}$ are the area COI frequency and area total inertia, respectively, which can be expressed as follows:

$$f_{COI,i} = \sum_{m \in M_1} \frac{f_{G,m} H_{G,m} S_{G,m}}{H_{G,m} S_{G,m}}, \quad (2a)$$

$$H_{A,i} = \sum_{m \in M_i} \frac{H_{G,m} S_{G,m}}{S_{G,m}}. \quad (2b)$$

In (2), $M_i$ is the set of generators in i-th area, including synchronous generators and VI-controlled RPGs; $f_{G,j}$, $H_{G,j}$, and $S_{G,j}$ are the frequency, inertia, and rated capacity of j-th generator, respectively. It should be noted (1) would degenerate to the generator swing equation for the N-th area, and (2a) and (2b) are the generator rotor frequency and inertia, respectively.

The variations of mechanical power $P_A^M$ and load active power $P_A^D$ can be neglected in the case of small disturbance situations. The linearized form of (1) can be approximated as $$2H_{A,i} \frac{d\Delta f_{COI,i}}{dt} \approx -\Delta P_{A,i}^L, \tag{3}$$

where in $d\Delta\{\bullet\}/dt$, the incremental operation is performed before the time derivative operation.

Based on (3), the boundary-based methods estimate the area inertia online with the measured inter-area active power $P_A^L$ and area COI frequency $f_{COI}$. As shown in FIG. 1 all the boundary buses must be installed with PMUs to monitor the inter-area lines. This leads to a strict and large number of boundary PMU placement requirement. In addition, the measured data by all the PMUs should have high quality, which is difficult for field application. In (1), the frequency dynamics correlation among different areas has been decoupled. Therefore, relatively strict PMU installation requirement has to be enforced.

III. Exemplary Area-Level Inertia Estimation Method

The organization of this section is as follows: inter-area equivalent frequency dynamics model for multi-area power systems is proposed in Section III-A; the mathematical model for area-level inertia estimation under the small disturbance situation is given in Section III-B; in Section III-C, the online data required for the area-level inertia identification is clarified, and the nonlinear parameter identification problem is established; the parameter identifiability is analyzed in Section III-D; finally, the area inertia estimation procedure is devised in Section III-E.

IV. Inter-Area Equivalent Frequency Dynamics

Figure 3:
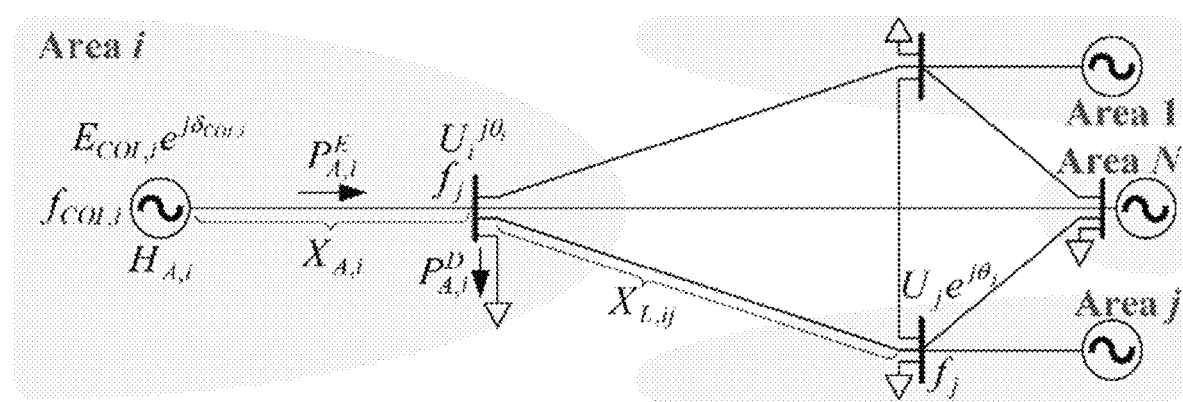
FIG. 3 shows an exemplary area-level inertia equivalent model using the disclosed method.

Based on the inter-area coupling shown in FIG. 1, a counterpart of the multi-area power system described in Section II is constructed, as shown in FIG. 3. FIG. 3 shows an exemplary area-level inertia equivalent model using the disclosed method. Compared with the equivalent model for the boundary-based method shown in FIG. 2, FIG. 3 is different at both the intra-area and inter-area scales. At the intra-area scale, the bus inside each equivalent area in FIG. 3 represents the actual bus in the grid, which can be arbitrarily selected. The area-level aggregated generator is connected to the selected bus. Note that for the N-th area there is only one actual bus. At the inter-area scale, the selected actual buses in any two areas are connected by an equivalent inter-area line.

For the i-th area, the dynamics of the aggregated generator is given in (4), where (4a) and (4b) are the second-order COI swing equations, and (4c) calculates the active power output of the aggregated generator, as follows:

$$2H_{A,i} \frac{df_{COI,i}}{dt} = P_{A,i}^M - P_{A,i}^E, \tag{4a}$$

$$\frac{d\delta_{COI,i}}{dt} = f_N(f_{COI,i} - 1), \tag{4b}$$

$$P_{A,i}^E = \frac{E_{COI,i} U_i}{X_{A,i}} \sin(\delta_{COI,i} - \theta_i), \tag{4c}$$

where $E_{COI,i} e^{j\delta_{COI,i}}$ and $U_i e^{j\theta_i}$ are the emf of aggregated generator and the voltage phasor of the actual bus, respectively; $X_{A,i}$ is the equivalent internal reactance of the aggregated generator; $f_N$ is the nominal frequency; the other variables are defined in (1).

The frequency dynamics of the actual bus in the i-th area is given as follows:

$$\frac{d\theta_i}{dt} = f_N(f_{B,i} - 1), \tag{5}$$

where $f_{B,i}$ is the bus frequency.

To couple the frequency dynamics of each area, the active power output of the aggregated generator can be expressed as the sum of the power flows of the equivalent inter-area lines, as follows:

$$P_{A,i}^E = P_{A,i}^D + \sum_{j \in N, j \neq i} \frac{U_i U_j}{X_{L,ij}} \sin(\theta_i - \theta_j), \tag{6}$$

where $X_{L,ij}$ is the equivalent line reactance between i-th area and j-th area.

So far, the inter-area equivalent frequency dynamics can be described by (4)-(6), where (4) and (5) describe the frequency dynamics within each area. Compared to the boundary-based method, the actual bus frequency dynamics (5) is considered. The frequency measured by PMU placed at this actual bus would be used to estimate the area-level inertia. Equations (4b) and (4c) describing the phase angle are introduced to build up the connection between (4a) and (5). It should be noted that the active power in (4) and (5) is also unknown. Therefore, (6) is introduced to express the active power in another form, where the time-varying active power is represented by the measured voltage of the selected bus and the reactance of the equivalent tie-line.

V. Linear Approximation of Inter-Area Equivalent Frequency Dynamics

The area inertia estimation is implemented under the small disturbance condition, and the variations of mechanical power of generators and load active power can be ignored. Then, equations (4)-(6) can be linearized to constitute the mathematical model for area inertia estimation.

The variables in (4)-(6) are linearized as $\Delta\{\bullet\} = \{\bullet\} - \{\bullet\}^{(0)}$, where the superscript $\{\bullet\}^{(0)}$ represents the linearization point. Firstly, (4) can be linearized as $$2H_{Ai} \frac{d\Delta f_{COI,i}}{dt} = -\Delta P_{A,i}^E, \tag{7a}$$

$$\frac{d\Delta\delta_{COI,i}}{dt} = f_N \Delta f_{COI,i}, \tag{7b}$$

$$\Delta P_{A,i}^E = K_{Ai}(\Delta\delta_{COI,i} - \Delta\theta_i), \tag{7c}$$

$$K_{A,i} = \frac{E_{COI,i}^{(ss)} U_i^{(ss)}}{X_{A,i}} \cos(\delta_{COI,i}^{(ss)} - \theta_i^{(ss)}) \tag{7c}$$

where $K_{A,i}$ is the linearization coefficient of the generator active power; the superscript $\{\bullet\}^{(ss)}$ denotes that the steady-state value. It should be noted that $\{\bullet\}^{(0)}$ and $\{\bullet\}^{(ss)}$ may not be the same.

The linearized form of (5) can be given as $$\frac{d\Delta\theta_i}{dt} = f_N \Delta f_{B,i}. \tag{8}$$

And (6) can be linearized as $$\Delta P_{A,i}^E = \sum_{j \in N, j \neq i} K_{L,ij}(\Delta\theta_i - \Delta\theta_j), \tag{9a}$$

$$K_{L,ij} = \frac{U_i^{(ss)} U_j^{(ss)}}{X_{ij}} \cos(\theta_i^{(ss)} - \theta_j^{(ss)}), \tag{9b}$$

where $K_{A,i}$ is the linearization coefficient of inter-area active power.

Without taking the mechanical power and load power into account, the transient processes of the variables in (7)-(9) are determined by the initial conditions of the state variables, namely $f_{COI,i}$, $\delta_{COI,i}$, and $\theta_i$. In (7a) and (7b), the initial conditions of the state variables $f_{COI,i}$ and $\delta_{COI,i}$ are their values at the linearization points, thus have $$f_{COI,i}^{init} = f_{COI,i}^{(0)}, \tag{10a}$$

$$\delta_{COI,i}^{init} = \delta_{COI,i}^{(0)}. \tag{10b}$$

In particular, according to the power system electromechanical transient analysis, $\theta_i$ in (8) is a dependent variable of the generator state variables and its initial condition need not be considered.

In summary, (7)-(9) represents a power system containing the frequency dynamics of the actual bus, where (10) is the initial condition. Apparently, the bus frequency dynamics will be affected by the area-level inertia.

TABLE I

DATA PREPARATION

Measurable Variables

| $f_{B,i}$ ($\forall i \in N$) | from PMU |
| $E_{COI,i}^{(ss)}, \delta_{COI,i}^{(ss)},$ and $\delta_{COI,i}^{(0)}$ ($\forall i \in N$) | from power flow calculation by SCADA/EMS |
| $U_i^{(ss)}$ and $\theta_i^{(ss)}$ ($\forall i \in N$) | from PMU or SCADA/EMS |
| $f_{COI,i}^{(0)}$ ($\forall i \in N$) | from PMU or SCADA/EMS |

Intermediate Variables $P_{A,i}^E, \delta_{COI,i}, f_{COI,i}, \theta_i$ ($\forall i \in N$)

Parameters To Be Estimated $H_{A,i}$ and $X_{A,i}$ ($\forall i \in N$)*; $X_{L,ij}$ ($\forall i \in N, \forall j \in N, i \neq j$)

*As discussed in Section III-D, $H_{A,N}$ is $X_{A,N}$ known in advance.

VI. Area-Level Inertia Estimation Model

In fact, the area-level inertia estimation model (7)-(10) constitute a parameter identification problem, where the measurable variables and the variables to be estimated should be highlighted. The results are summarized in Table I. For the measurable variables:

The frequency of the selected actual buses can be measured online by PMU.

Since only one sampling moment is covered, the amplitude and phase angle of area COI emf at the steady state can be obtained from SCADA/EMS, where the power system states variables are calculated by power flow calculation or state estimation. The phase angle of emf at the linearization point, also corresponding to the sampling moment, can also be calculated using the above method.

The amplitude and phase angle of the actual bus voltage at the sampling moment can be measured by PMU or obtained from SCADA/EMS.

The area COI frequency at the linearization point can be obtained from SCADA/EMS. In addition, when the system transient process is not significant at the linearization point, the frequency spatial difference within one area is slight, and the area COI frequency can be approximated by the PMU-measured frequency of the actual bus in this area.

In addition to the measurable variables, the dynamics of active power, the phase angle of COI emf, and COI frequency, which cannot be measured by either the PMU at the selected bus or the SCADA system, are referred to as intermediate variables. Besides, as shown in (8), the voltage phase angle of the actual bus is correlated to the bus frequency and belongs to intermediate variables.

From Table I, the equivalent internal reactance of the area aggregated generator and equivalent inter-area line reactance are unknown and need to be estimated along with the area-level inertia.

The parameter identification problem is given as (11). The vector $\hat{\Psi}$ consisting of the parameters to be estimated is presented in (11b). Based on $\hat{\Psi}$ and the power flow related variables, the bus frequency dynamics can be estimated, as shown in (11c). Specifically, (11a) is the objective of parameter identification model, i.e., to find the optimal $\hat{\Psi}_*$ that minimizes the square sum errors between the calculated bus frequency dynamics and the PMU measured bus frequency dynamics.

$$\min_{\hat{\Psi}_*} \left( \int_{t^0}^{t^0+T} \sum_{i \in N} (\hat{f}_{B,i}(\hat{\Psi}) - f_{B,i})^2 dt \right), \tag{11a}$$

$$\hat{\Psi} = \{\hat{H}_{A,i}, \hat{X}_{A,i}, \hat{X}_{L,ij}\}, \tag{11b}$$

$$\hat{f}_{B,i} = g(\hat{\Psi}, f_{COI,i}^{(0)}, \delta_{COI,i}^{(0)}, E_{COI,i}^{(ss)}, \delta_{COI,i}^{(ss)}, U_i^{(ss)}, \theta_i^{(ss)}), \tag{11c}$$

In (11), g(•) denotes the DAE equations shown in (7)-(10); $t^0$ is the moment corresponding to the linearization point; T is the data window length.

Although the system model given in (7)-(10) has been linearized, the parameters to be estimated are in a nonlinear form. For example, combining (7a), (7b), and (7d), (12) can be obtained, where the parameters $H_{A,i}$ and $X_{A,i}$ appear in the product form. Thus, the nonlinear parameter identification procedure is required, which mainly includes Newton based methods and intelligent algorithm based methods. Considering the high nonlinearity structure and the high dimension of the parameter vector, Newton based methods may converge to a wrong local optimum. In this disclosure, the PSO is adopted in the devised nonlinear parameter identification procedure.

$$2H_{A,i} X_{A,i} \frac{d\Delta f_{COI,i}}{dt} = -E_{COI,i}^{(ss)} U_i^{(ss)} \cos(\delta_{COI,i}^{(ss)} - \theta_i^{(ss)}) \times (\Delta\delta_{COI,i} - \Delta\theta_i). \tag{12}$$

VII. Area-Level Inertia Identifiability Analysis

One can analyze whether the area-level inertia can be identified based on the measurable variables in Table I or not. The transfer function based method is adopted for the identifiability analysis. Equations (7)-(10) are Laplace transformed and written in the matrix form as follows:

$$2H_A s(\Delta f_{COI} - \Delta f_{COI}^{(0)}) = -\Delta P_A^E, \quad (13a)$$

$$s(\Delta \delta_{COI} - \Delta \delta_{COI}^{(0)}) = f_N \Delta f_{COI}, \quad (13b)$$

$$\Delta P_A^E = K_A(\Delta \delta_{COI} - \Delta \theta), \quad (13c)$$

$$K_A = \begin{bmatrix} K_{A,1} & \cdots & 0 & \cdots & 0 \\ \vdots & \ddots & \vdots & \ddots & \vdots \\ 0 & \cdots & K_{A,i} & \cdots & 0 \\ \vdots & \ddots & \vdots & \ddots & \vdots \\ 0 & \cdots & 0 & \cdots & K_{A,N} \end{bmatrix}, \quad (13d)$$

$$s\Delta\theta = f_N \Delta f_B, \quad (14)$$

$$\Delta P_A^E = K_L \Delta\theta, \quad (15a)$$

$$K_L = \begin{bmatrix} \sum_{\substack{j \in N \\ j \neq 1}} K_{L,1j} & \cdots & -K_{L,1i} & \cdots & -K_{L,1N} \\ \vdots & \ddots & \vdots & \ddots & \vdots \\ -K_{L,i1} & \cdots & \sum_{\substack{j \in N \\ j \neq i}} K_{L,ij} & \cdots & -K_{L,iN} \\ \vdots & \ddots & \vdots & \ddots & \vdots \\ -K_{L,N1} & \cdots & -K_{L,Ni} & \cdots & \sum_{\substack{j \in N \\ j \neq N}} K_{L,Nj} \end{bmatrix} \quad (15b)$$

where $s$ is the Laplace transform operator; all variables are expressed in a column vector form, e.g., $f_{COI} = [\Delta f_{COI,1}, \ldots, \Delta f_{COI,i}, \ldots, \Delta f_{COI,N}]^*$, and the superscript $\{\bullet\}^*$ indicates the transpose operation; the elements in $K_A$ and $K_L$ are expressed by (7d) and (9b), respectively. It should be noted that the initial states of the state variables given in (10) is embedded in (13).

By eliminating the intermediate variables in Table I and aggregating the measurable variables and parameters to be estimated, (13)-(15) can be constructed as a multiple-input-multiple-output system as follows:

$$Y(s) = G(s)X(s), \quad (16a)$$

$$X(s) = f_N s^{-1} \Delta f_B, \quad (16b)$$

$$Y(s) = f_N s^{-1}(\Delta f_{COI}^{(0)} - \Delta f_B) \quad (16c)$$

$$G(s) = (K_A + f_N s^{-1}(2H_A s)^{-1})K_L =$$

$$\begin{bmatrix} \dfrac{\sum_{j \in N, j \neq 1} K_{L,1j}}{K_{A,1}} + \dfrac{f_N \sum_{j \in N, j \neq 1} K_{L,1j}}{2H_{A,1} s^2} & \cdots & -\dfrac{K_{L,1i}}{K_{A,1}} \dfrac{f_N K_{L,1i}}{2H_{A,1} s^2} & \cdots & -\dfrac{K_{L,1N}}{K_{A,1}} \dfrac{f_N K_{L,1N}}{2H_{A,1} s^2} \\ \vdots & \ddots & \vdots & \ddots & \vdots \\ -\dfrac{K_{L,i1}}{K_{A,i}} \dfrac{f_N K_{L,i1}}{2H_{A,i} s^2} & \cdots & \dfrac{\sum_{j \in N, j \neq 1} K_{L,ij}}{K_{A,i}} + \dfrac{f_N \sum_{j \in N, j \neq 1} K_{L,ij}}{2H_{A,i} s^2} & \cdots & -\dfrac{K_{L,iN}}{K_{A,i}} \dfrac{f_N K_{L,iN}}{2H_{A,i} s^2} \\ \vdots & \ddots & \vdots & \ddots & \vdots \\ -\dfrac{K_{L,N1}}{K_{A,N}} \dfrac{f_N K_{L,N1}}{2H_{A,N} s^2} & \cdots & -\dfrac{K_{L,Ni}}{K_{A,N}} \dfrac{f_N K_{L,Ni}}{2H_{A,N} s^2} & \cdots & \dfrac{\sum_{j \in N, j \neq N} K_{L,Nj}}{K_{A,N}} + \dfrac{f_N \sum_{j \in N, j \neq N} K_{L,Nj}}{2H_{A,N} s^2} \end{bmatrix}$$

where $X(s)$ and $Y(s)$ are the input and output, respectively; $G(s)$ is the constructed transfer function matrix.

At this point, the area-level inertia identifiability could be verified from the following two aspects.

Aspect 1: The input and output in (16) are measurable, and the parameters to be estimated appear in the transfer function matrix. According to the system identification theory, the transfer function coefficients in (15d) can be uniquely identified. Letting the homogeneous and quadratic terms in the coefficients be written as $\hat{h}$ and $\hat{q}$, respectively, the identified transfer function matrix can be described as:

$$\hat{G}(s) = \begin{bmatrix} \hat{h}_{11} + \dfrac{\hat{q}_{11}}{s^2} & \cdots & \hat{h}_{1i} + \dfrac{\hat{q}_{1i}}{s^2} & \cdots & \hat{h}_{1N} + \dfrac{\hat{q}_{1N}}{s^2} \\ \vdots & \ddots & \vdots & \ddots & \vdots \\ \hat{h}_{i1} + \dfrac{\hat{q}_{i1}}{s^2} & \cdots & \hat{h}_{ii} + \dfrac{\hat{q}_{ii}}{s^2} & \cdots & \hat{h}_{iN} + \dfrac{\hat{q}_{iN}}{s^2} \\ \vdots & \ddots & \vdots & \ddots & \vdots \\ \hat{h}_{N1} + \dfrac{\hat{q}_{N1}}{s^2} & \cdots & \hat{h}_{Ni} + \dfrac{\hat{q}_{Ni}}{s^2} & \cdots & \hat{h}_{NN} + \dfrac{\hat{q}_{NN}}{s^2} \end{bmatrix} \quad (17)$$

In (17), taking the element of 1st row and 2nd column as an example, $\hat{h}_{1i}$ and $\hat{q}_{1i}$ correspond to $-K_{L,1i}/K_{A,1}$ and $-K_{L,1i}f_N/2H_{A,1}$ in (15d), respectively.

Aspect 2: The parameters to be estimated need to be solved from the above identified coefficients. As seen in (15d), since the diagonal elements can be linearly represented by other elements of the same row or column, the rank of matrix $G(s)$ is $N\times(N-1)$. Combining (17) and (16d), in which the elements are given in the detailed expressions, $2N\times(N-1)$ equations can be given as follows:

$$\begin{cases} \hat{h}_{1i} = -\dfrac{U_1^{(ss)} U_i^{(ss)} \cos(\theta_1^{(ss)} - \theta_i^{(ss)})}{E_{COI,1}^{(ss)} U_1^{(ss)} \cos(\delta_{COI,1}^{(ss)} - \theta_1^{(ss)})} \times \dfrac{X_{A,1}}{X_{1i}}, \\ \hat{q}_{1i} = -\dfrac{f_N U_1^{(ss)} U_i^{(ss)} \cos(\theta_1^{(ss)} - \theta_i^{(ss)})}{2 E_{COI,1}^{(ss)} U_1^{(ss)} \cos(\delta_{COI,1}^{(ss)} - \theta_1^{(ss)})} \times \dfrac{X_{A,1}}{H_{A,1} X_{1i}}, \\ \vdots \\ \hat{h}_{Ni} = -\dfrac{U_N^{(ss)} U_i^{(ss)} \cos(\theta_N^{(ss)} - \theta_i^{(ss)})}{E_{COI,N}^{(ss)} U_N^{(ss)} \cos(\delta_{COI,N}^{(ss)} - \theta_N^{(ss)})} \times \dfrac{X_{A,N}}{X_{Ni}}, \\ \hat{q}_{Ni} = -\dfrac{f_N U_N^{(ss)} U_i^{(ss)} \cos(\theta_N^{(ss)} - \theta_i^{(ss)})}{E_{COI,N}^{(ss)} U_N^{(ss)} \cos(\delta_{COI,N}^{(ss)} - \theta_N^{(ss)})} \times \dfrac{X_{A,N}}{H_{A,N} X_{Ni}}. \end{cases} \quad (18)$$

In (18), there are $(2N+N\times(N-1)/2)$ unknown parameters, i.e., $H_{A,i}$, $X_{A,i}$, and $X_{L,ij}$ as listed in Table I. The number of equations is larger than the number of unknowns, and the equations are solvable. However, these parameters appear in fraction form on one side of the equations, and only the ratio of any two parameters can be obtained. When any one of the $(2N+N\times(N-1)/2)$ parameters is known in advance, the equations can be solved completely.

In summary, to solve the identification problem in Section III-C, all the parameters listed in Table I of any one area should be known in advance. Fortunately, as shown in FIG. 1, the placed PMU can monitor the N-th area completely since only one generator is contained. The internal reactance $X_{A,N}$ of the N-th area can be identified in advance based on the Thevenin equivalent. Alternatively, the inertia $H_{A,N}$ of the N-th area can also be calculated in advance through boundary measurements.

VIII. Area-Level Inertia Estimation Procedure

Step 1—PMU Placement: The power system is partitioned as a multi-area system as shown in FIG. 1. The PMU is placed at any selected bus in each area. It should be noted that the PMU placement location is not optional for the N-th area which contains only one generator and one bus.

Step 2—Online Measurement: According to Table I, the bus frequencies are measured by the PMUs. The power flow related data, such as amplitude and phase angle of bus voltage, are measured from PMU or SCADA/EMS.

Step 3—Data Preparation: During small disturbance situations, the data window for inertia estimation is specified. The measured frequencies within the data window are prepared. For the power flow related variables in Table I, the variables at the linearization point, corresponding to the head of the data window, and the variables at the system steady-state are prepared, respectively. In addition, the internal reactance or inertia of the area containing only a single generator is prepared in advance according to the identifiability analysis.

Step 4—Area-level Inertia Estimation: The area-level inertia are estimated by PSO according to (11). The area equivalent internal reactance and the equivalent inter-area line reactance can be obtained simultaneously.

Low-inertia power systems face frequency instability problems, leading to power system blackouts. Online estimation of power system inertia is of great significance. The area-level inertia represents the level of inertia in the power system and the spatial distribution characteristics of system inertia. The area-level frequency dynamics can be simply characterized by combining the area-level inertia, the area-equivalent internal reactance, and the equivalent inter-area line reactance.

Therefore, online estimation of area-level inertia and equivalent reactances is important for power grid dispatchers. On the one hand, by obtaining the online area-level inertia, dispatchers can grasp the real-time frequency stability level and the real-time degree of frequency spatial distribution. Then, dispatchers can issue alarms when the frequency instability might occurs. On the other hand, by obtaining the online area-level inertia and equivalent reactances, dispatchers can grasp the real-time area-level frequency dynamics. When the online inertia level is low, dispatchers can take optimal control measures to ensure frequency stability, such as the optimal allocation of inertia from battery storage and unit commitment optimization of synchronous generators.

IX. Case Studies

X. Description of the Modified IEEE 39-Bus System

Figure 4:
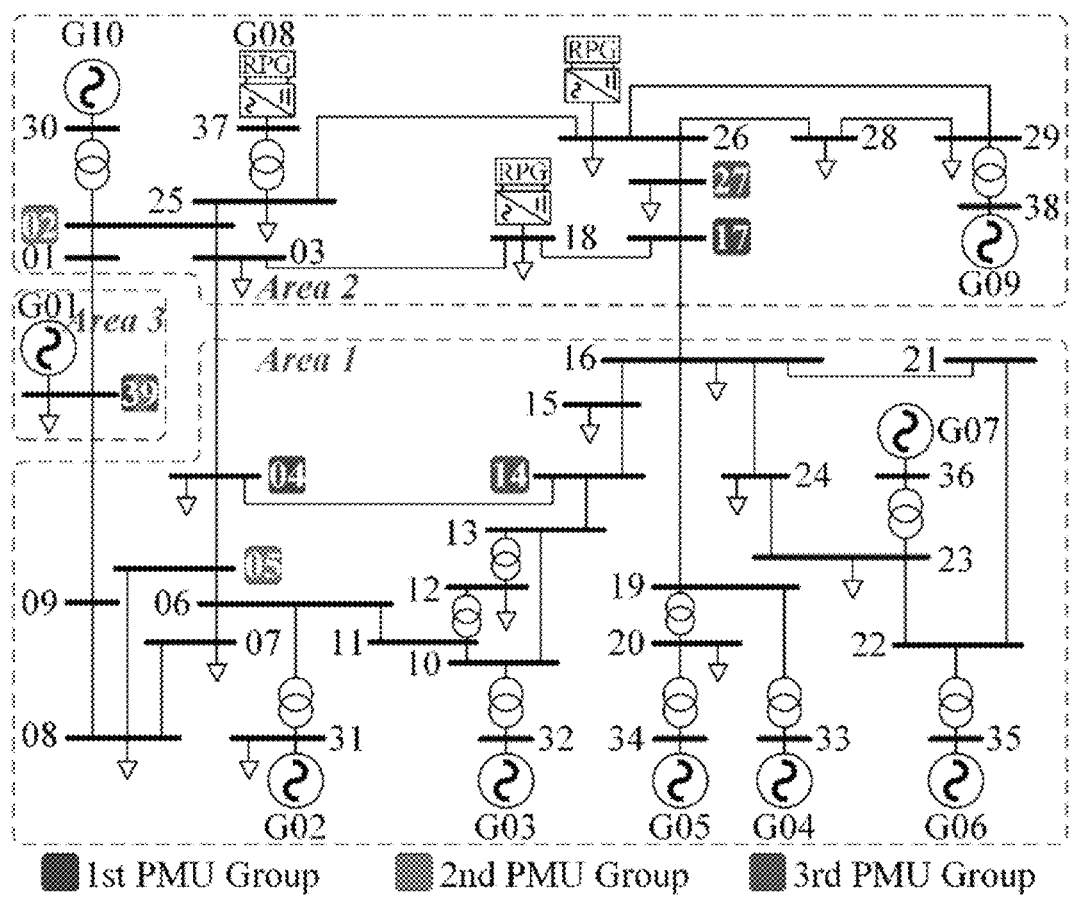
FIG. 4 shows exemplary topology of a modified IEEE 39-bus system.

The disclosed method is validated in the modified IEEE 39-bus system. The lengths of lines 01_39, 03_04, 09_39, and 16_17 are increased, and the system can be divided into three areas: area 1 is dominated by synchronous generators; area 2 is penetrated with RPGs and contains fewer synchronous generators; area 3 has only one generator, which indicates the external grid. In area 2, G08 is a VSG-controlled RPG and can provide VI. The RPGs connected to buses 18 and 26 operates in the MPPT mode. FIG. 4 shows exemplary topology of a modified IEEE 39-bus system. The true values of generator inertia are gathered in Table II. It can be seen that the inertia of area 2 is low due to PRG penetration.

TABLE II

| | | GENERATOR PARAMETER | | | |
|---|---|---|---|---|---|
| Area | Gen. | Bus | Type | Capacity (MVA) | Inerita (s)* |
| 1 | G02 | 31 | SG | 700 | 2.61 |
| | G03 | 32 | SG | 800 | 3.75 |
| | G04 | 33 | SG | 800 | 5.55 |
| | G05 | 34 | SG | 300 | 5.51 |
| | G06 | 35 | SG | 800 | 3.70 |
| | G07 | 36 | SG | 700 | 2.52 |
| | Total | / | / | 4100 | 23.64 |
| 2 | G08** | 37 | RPG | 700 | 5.48** |
| | G09 | 38 | SG | 1000 | 1.70 |
| | G10 | 30 | SG | 1000 | 4.82 |
| | Total | / | / | 2700 | 12.00 |
| 3 | G01 | 39 | SG | 10000 | 30.00 |

*Rated in 100 MVA;
**VI of RPG.

Figure 5:
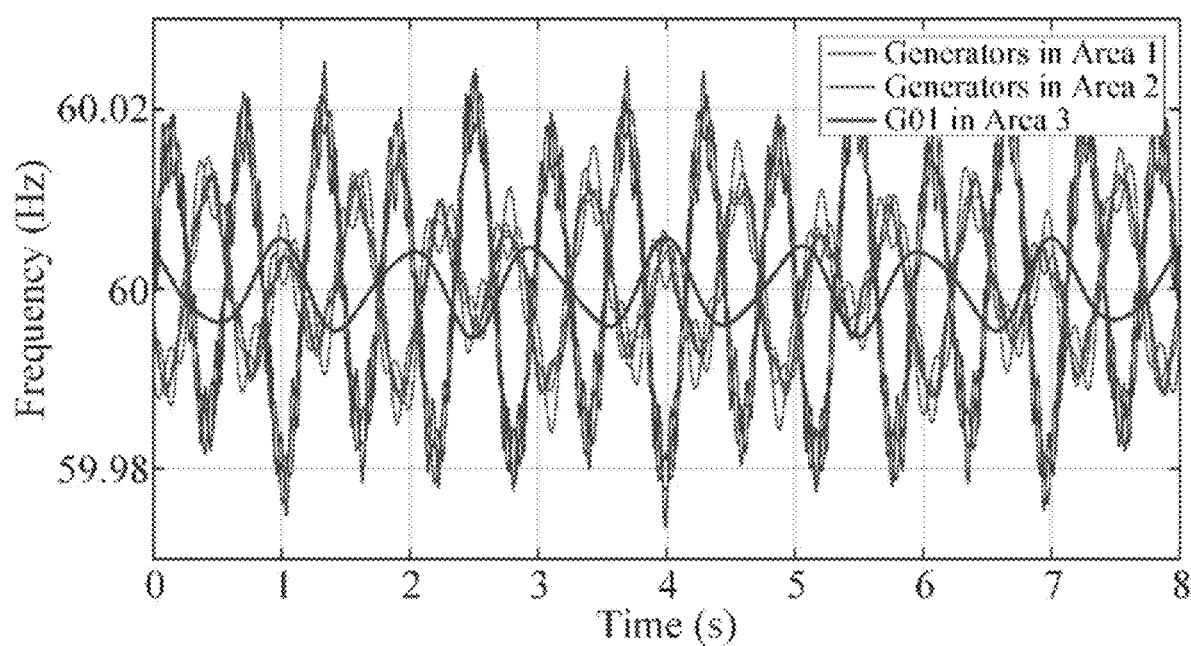
FIG. 5 shows exemplary generator rotor post-disturbance dynamics under a small disturbance.

FIG. 5 shows exemplary generator rotor post-disturbance dynamics under a small disturbance. The post-disturbance rotor dynamics of all the generators with small fluctuations of the load connected to bus 03 are shown in FIG. 5, where curves colors are distinguished by rotor locations. It can be seen that the generators in the same area are coherent. The frequency fluctuation is less than ±0.03 Hz, which is much smaller than the governor deadband, indicating a small disturbance condition.

The PSO identification calls MATLAB build-in function and is performed on a PC with Intel® Xeon® Platinum 8260 L CPU @ 3.90 GHz and 40 GB memory. The time-domain simulation is performed by solving the power system differential-algebraic equations (DAEs) on MATLAB.

XI. Validation of the Proposed Method

According to Section III-E, the disclosed method requires the PMU to be placed at one selected bus in each area. Here, the PMU data of buses 04, 17, and 39 in areas 1, 2, and 3, respectively, are employed to estimate the area-level inertia. The small disturbance situation shown in FIG. 5 is created, and the load fluctuations are distributed at buses 03, 16, and 39. The bus frequencies measured by the 3 PMUs at the reporting rate of 120 Hz as well as the steady-state power system state at linearization point are collected. The data window length for parameter identification is 8 seconds. The internal reactance of G01, i.e., area 3, is considered known in advance.

Figure 6A:
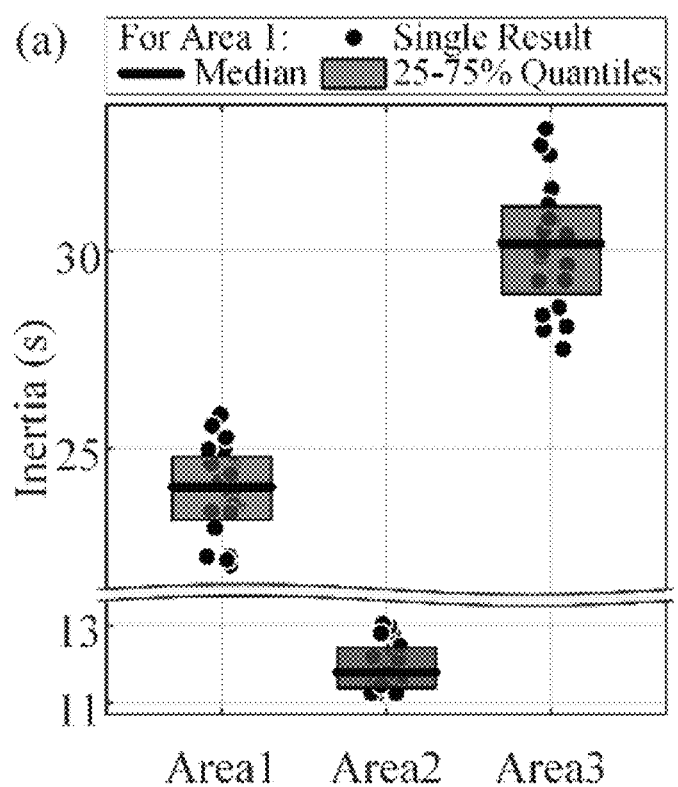
FIG. 6A shows area inertia estimation results in statistical view.
Figure 6B:
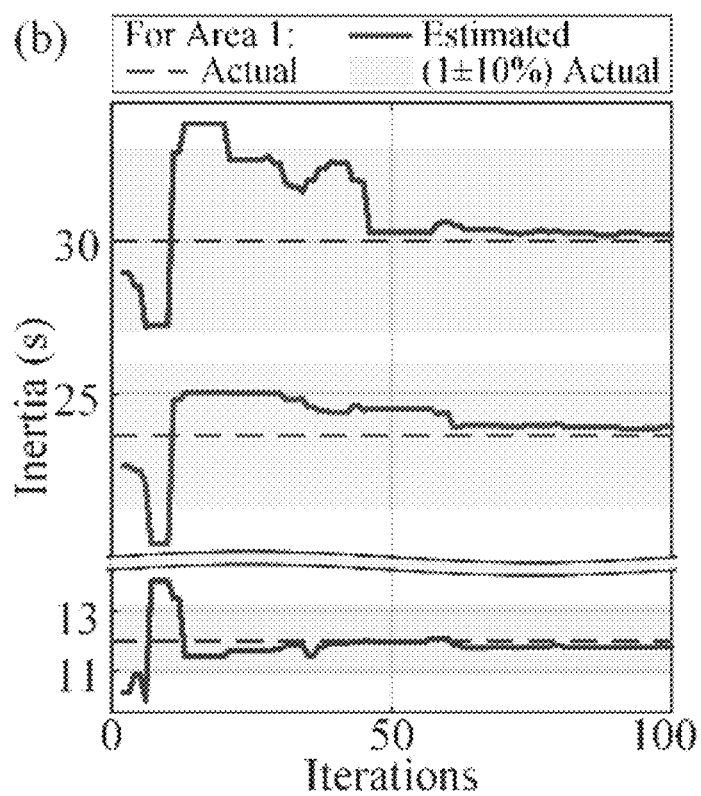
FIG. 6B shows area inertia estimation results in iterative view.

The area-level inertia estimation is carried out repeatedly under various system operating conditions. FIG. 6A shows area inertia estimation results in statistical view and FIG. 6B shows area inertia estimation results in iterative view. The estimated inertia values are presented in a boxplot shown in FIG. 6A, where each data point indicates the result of a single estimation. The median and 25-75% quantiles of all the results are also shown. It can be seen that the estimated values are distributed around the actual value considering the difference in working conditions and the randomness in PSO optimizing process. The quantitative analysis is given in Table III. It can be seen that the median value, as the final reference of the inertia estimation, has a maximum error of 1.20%, which occurs in area 1. The errors of the quantile value are relatively larger but still acceptable.

TABLE III

QUANTIFICATION OF AREA INERTIA ESTIMATION RESULTS

| Area | Median Inertia (s) | Median Error (%) | 25% Quantile Inertia (s) | 25% Quantile Error (%) | 75% Quantile Inertia (s) | 75% Quantile Error (%) |
|---|---|---|---|---|---|---|
| 1.00 | 23.92 | 1.20 | 23.19 | −1.89 | 24.79 | 4.90 |
| 2.00 | 11.94 | −0.49 | 11.38 | −5.15 | 12.43 | 3.58 |
| 3.00 | 30.15 | 0.51 | 28.90 | −3.65 | 31.12 | 3.75 |

Taking a particular estimation as an example, the iterative process of PSO identification is given in FIG. 6B. The result of the first iteration is already quite close to the actual value. The identification results for all the areas converge within (1±10%) of the actual value after a wide range of oscillation, approximately 30 iterations. After 100 iterations, the estimated inertia are almost identical to the actual value. The average computation time for a single-shot estimation is 16.02 seconds, which could be implemented online. It should be noted that the time burden of PSO can be reduced by parallel computing.

Figure 7:
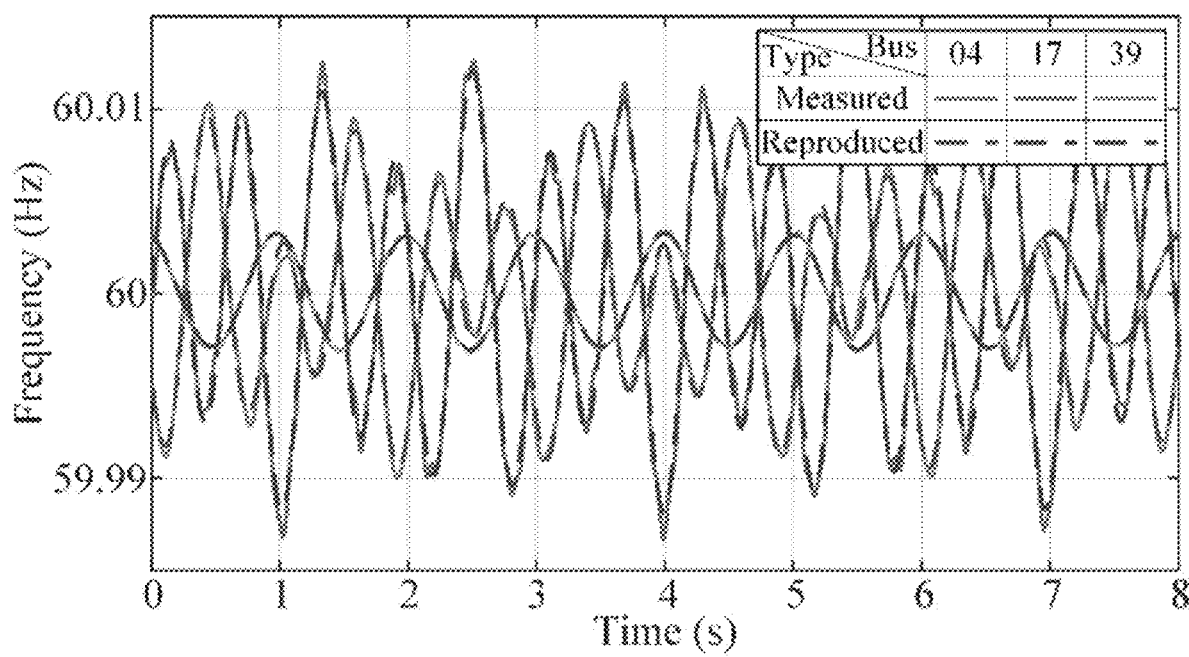
FIG. 7 shows exemplary frequency dynamics reproduction based on the estimated inertia.

FIG. 7 shows exemplary frequency dynamics reproduction based on the estimated inertia. Based on the estimated area-level inertia in Table III, the estimated reactance parameters in Table V, and the system dynamics (7)-(10), the frequencies of buses 04, 17, and 39 can be reproduced and shown in FIG. 7. Compared with the PMU-measured frequency $f_{B,i}$, the absolute error, defined in (19), of the reproduced frequency $f_{B,i}$ is 8.32%, which verify the effectiveness of the proposed inertia estimation model.

$$\text{error} = \frac{1}{N \times T} \int_0^T \sum_{i \in N} \left| \frac{\hat{f}_{B,i} - f_{B,i}}{f_{B,i}} \right| dt \times 100 \tag{19}$$

where T is 8 seconds; N includes the above 3 buses placed with PMUs and N equals 3.

TABLE IV

AREA INERTIA ESTIMATION RESULTS OF BOUNDARY-BASED METHOD

| Area | Inertia (s) | Error (%) |
|---|---|---|
| 1 | 24.46 | 3.49 |
| 2 | 12.59 | 4.92 |
| 3 | 29.79 | −0.70 |

For comparison, the area-level inertia estimation is carried out by boundary-based method under the same system operating condition, and the results are summarized in Table IV. As discussed in Section II, the PMU must be placed at all the boundary buses, i.e., 04, 09, 16 for area 1, 01, 03, 17 for area 2, and 39 for area 3. The PMU measures the active power of inter-area lines and calculates the area COI frequency based on the average of the PMU measured frequencies. The area inertia is calculated using the ratio of active power and frequency. As shown in Table IV, the estimation errors of the boundary-based method and the disclosed method are similar, despite the strict requirement of PMU placement. In addition, for the area 1 and area 2 containing multiple generators, the estimation errors of the boundary-based method are much higher than the proposed method, which is due to the inaccurate calculation of the area COI frequency.

XII. Impact of the Selected PMU Groups

The disclosed method is validated under different PMU groups, including the 2 nd and 3 rd PMU groups as shown in FIG. 4, i.e., the buses {05, 02, 39} and {14, 27, 39}. As can be seen in Table V, the area inertia estimation results are still accurate while PMU group changes.

TABLE V

ESTIMATION RESULTS FOR ALL THE PARAMETERS

| Parameter | | 1st | 2nd | 3rd |
|---|---|---|---|---|
| Inertia (s) | Area 1 | 23.92 | 23.06 | 23.43 |
| | Area 2 | 11.94 | 12.32 | 11.40 |
| | Area 3 | 30.15 | 29.79 | 29.26 |
| Internal | Area 1 | 0.021 | 0.002 | 0.001 |
| Reactance (p.u.)* | Area 2 | 0.086 | 0.023 | 0.033 |
| Inter-area | Area 1 − Area 2 | 0.160 | 0.219 | 0.258 |
| Reactance (p.u.) | Area 1 − Area 3 | 0.579 | 0.480 | 0.468 |
| | Area 2 − Area 3 | 0.476 | 0.423 | 0.621 |

*Internal reactance of area 3 is known in advance.

From Table I, it can be observed that the estimation results of equivalent topology related parameters, i.e., the equivalent inter-area reactance and the area equivalent internal reactance, are significantly different while the PMU group changes, which is in line with common sense. Estimating reactance adaptively is a prerequisite condition to ensure accurate inertia estimation. Although the estimation errors of the reactance parameters cannot be defined due to the inexistence of the true value, quantitative analysis could be conducted. For example, compared to the 1 st PMU group, the PMUs placed in area 1 and area 2 in the 2 nd PMU group are closer to the generators inside the areas. As can be seen in Table V, the area equivalent internal reactances decrease and the equivalent inter-area line reactances increase in the 2 nd PMU group. Just to name another example, under the 3 rd PMU group, the PMU placed in area 2 is further away from area 1, and the inter-area reactance between area 1 and area 3 increases.

XIII. Impact of RPG Inertia Variation

Figure 8:
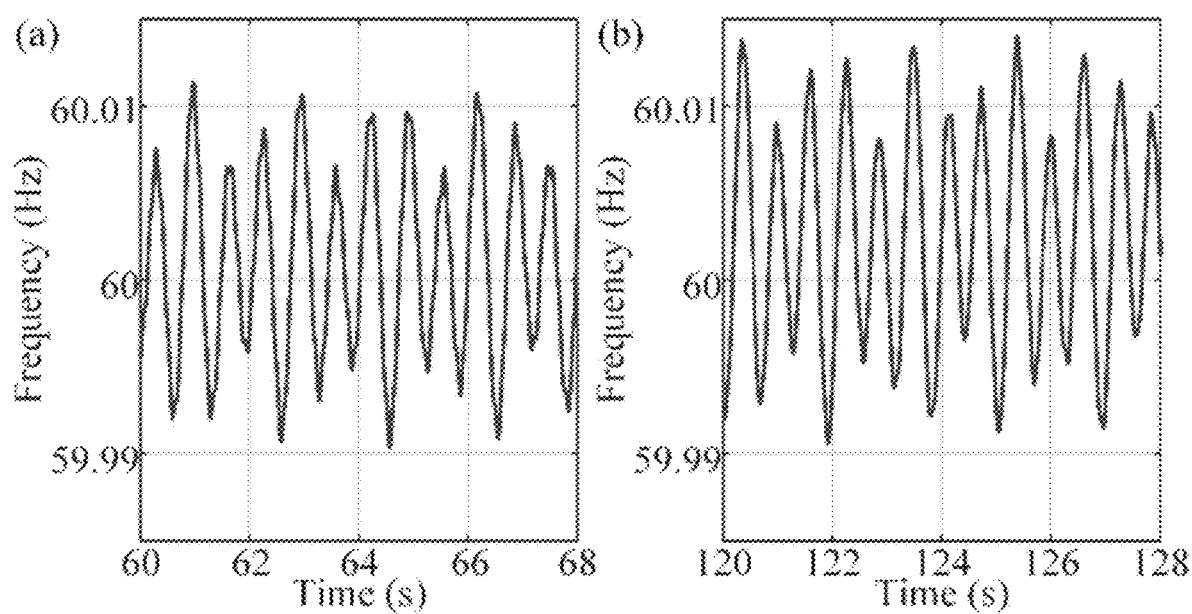
FIG. 8 shows exemplary bus 17 frequency after (a) 60 s and (b) 120 s.

The VI of the RPG could be time-varying. Based on the conditions in Section IV-A, the inertia of RPG G08 increases by 4 s and 2 s at t=60 s and t=120 s, respectively, and the inertia of area 2 becomes 16 s and 14 s accordingly. FIG. 8 shows exemplary bus 17 frequency after (a) 60 s and (b) 120 s. The frequency dynamics of bus 17 in area 2 under the above two situations is shown in FIG. 8. It can be seen that the change in area inertia cannot be directly reflected from the measured frequency.

Figure 9:
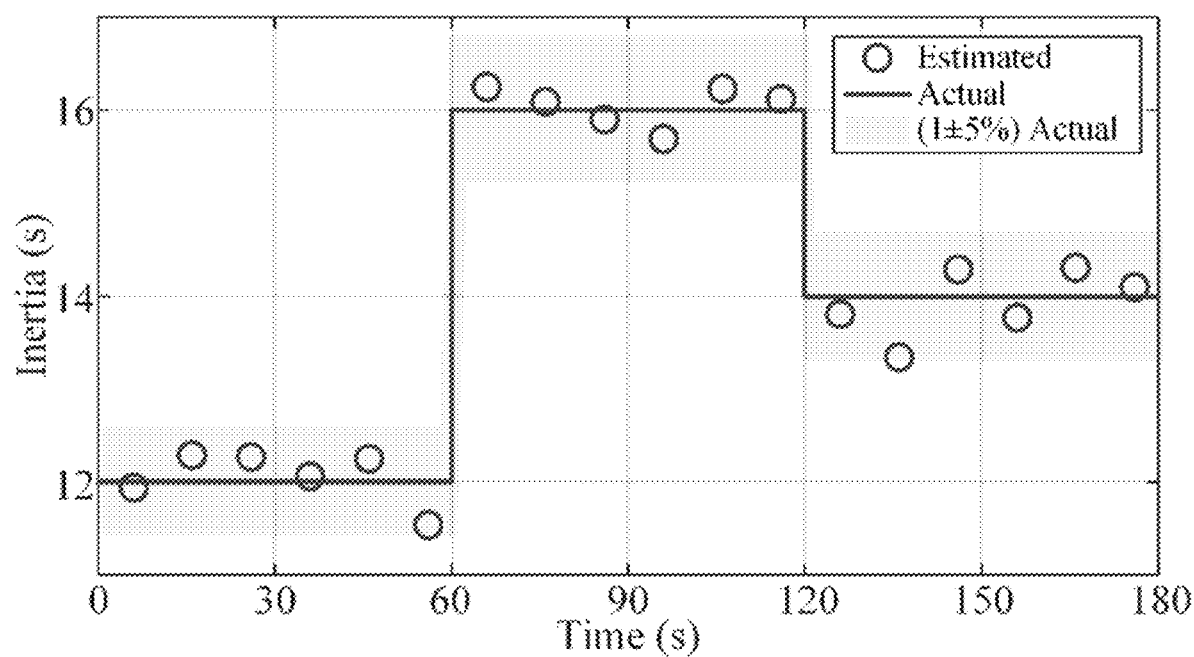
FIG. 9 shows exemplary online tracking of RPG inertia.

The disclosed method is executed every 10 seconds. FIG. 9 shows exemplary online tracking of RPG inertia. The inertia estimation results for area 2 are given in FIG. 9. The disclosed method accurately tracks the time-varying inertia with a small estimation error. This shows that the disclosed method exploits the behind-the-meter capability of PMU measurement, which is important for online control of power system frequency stability.

XIV. Results Under Different System Partitioning Conditions

Figure 10:
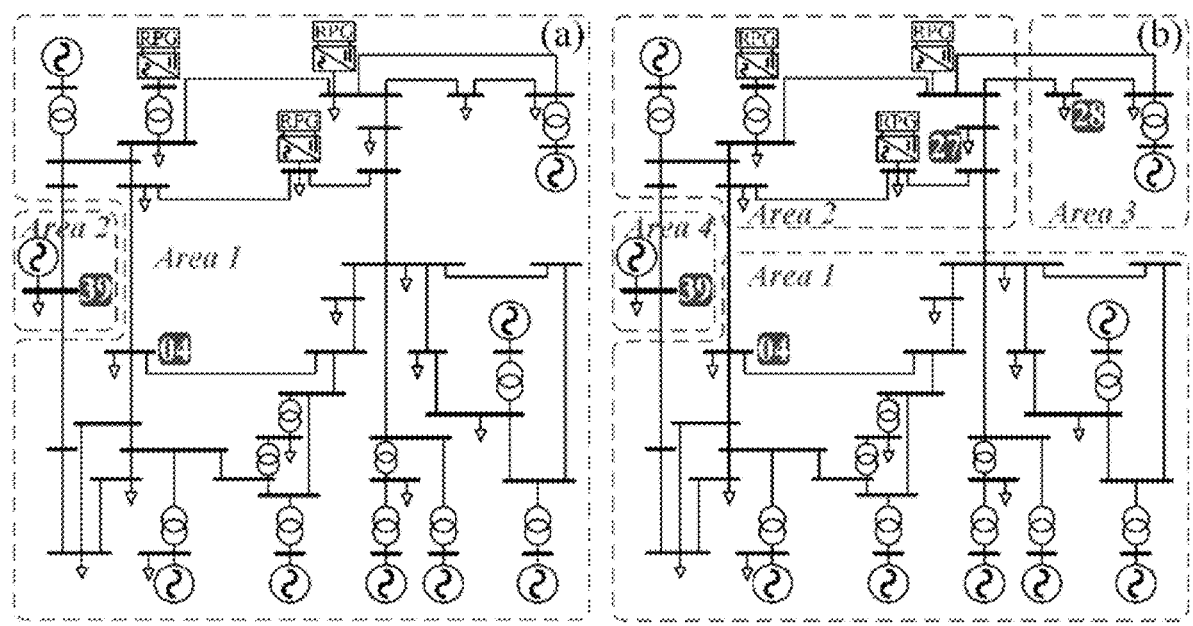
FIG. 10 shows exemplary modified IEEE 39-bus system with (a) two areas and (b) four areas.

FIG. 10 shows exemplary modified IEEE 39-bus system with (a) two areas and (b) four areas. Readjusting the lengths of the inter-area lines, the modified IEEE 39-bus system could be redivided as a two-area and a four-area power system, as shown in FIGS. 10(a) and (b), respectively. For the two-area case, the lengths of lines 01-39 and 09-39 are increased. For the four-area case, the lengths of lines 01-39, 03-04, 09-39, 16-17, 26-28, and 26-29 are increased. The selected PMUs are marked with green boxes in FIG. 10.

TABLE VI

AREA INERTIA ESTIMATION RESULTS FOR
DIFFERENT AREA PARTITIONING CASES

| Case | Area | Actual Inertia (s) | Estimated Inertia (s) | Error (%) |
|---|---|---|---|---|
| 2 areas | 1 | 35.64 | 34.64 | −2.79 |
| | 2 | 30.00 | 30.26 | 0.88 |
| 4 areas | 1 | 23.64 | 24.01 | 1.60 |
| | 2 | 1.70 | 1.69 | −0.84 |
| | 3 | 10.30 | 10.48 | 1.71 |
| | 4 | 30.00 | 29.79 | −0.70 |

XV. Online System Partitioning Variation Monitoring

The switching of inter-area transmission lines may lead to changes of area partitioning, rendering the original PMU group no longer be sufficient. The disclosed method can be capable of identifying such situations online. Here, the four-area and three-area systems shown in FIG. 10(b) and FIG. 4, respectively, are employed as an example. The reactances of lines 26-28 and 26-29 decrease due to the switching of inter-area lines between area 3 and area 4, and the four-area system in FIG. 10(b) becomes the three-area system in FIG. 4.

Figure 11:
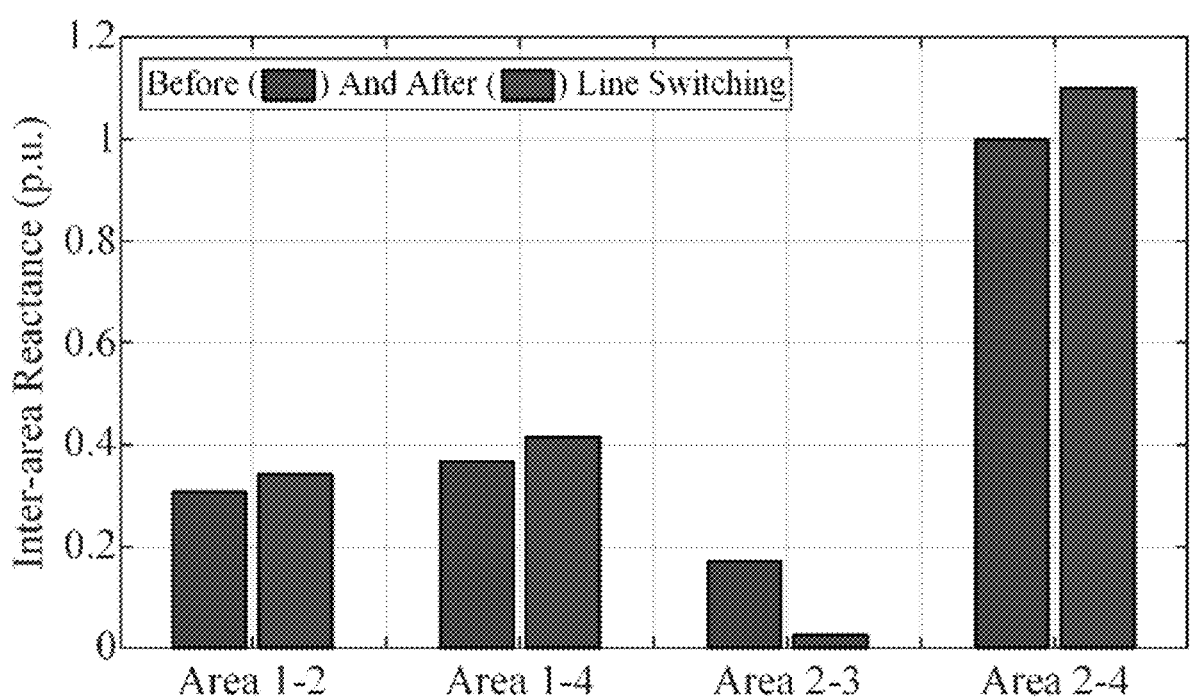
FIG. 11 shows exemplary inter-area line reactances in case of line switching.

FIG. 11 shows exemplary inter-area line reactances in case of line switching. Using the four PMUs selected in FIG. 10(b), the disclosed method is executed before and after the line switching event. The estimation results of equivalent inter-area lines reactances are shown in FIG. 11. It can be seen that the reactances between any two areas change to some extent afterwards. However, the variation of the reactance between area 2 and area 3 is the most significant and the reactance decreases to a very low value. It indicates area 2 and area 3 can be combined into one area, corresponding to the partitioning situation in FIG. 4. Therefore, the disclosed method can monitor the system partitioning condition online by the estimated inter-area line reactance.

XVI. Conclusion

This disclosure provides an exemplary method to estimate the area-level inertia considering inter-area equivalent frequency dynamics. The area boundary PMU placement requirements in the existing boundary-based method can be relaxed. The inter-area equivalent frequency dynamics model for the multi-area power system is developed. Within the area, in addition to the area aggregated swing equation, the frequency dynamics of the actual node is described, whose location can be arbitrarily selected. At the inter-area scale, the power flow equation of the equivalent tie line is introduced to characterize the connection between areas. Then, the mathematical model for area inertia estimation is established by linearization at the steady-state operating point. In this model, the frequency is measured by PMU, and the power flow related variables can be obtained by SCADA/EMS or PMU. The unknown parameters include the area equivalent internal reactance, the equivalent inter-area line reactance, and the area inertia, which appear in a non-linear form and could be identified by PSO. Finally, the parameter identifiability analysis yields that in order to identify the inertia parameters, the internal reactance or inertia of a single-generator area needs to be known in advance.

The effectiveness of the disclosed method is demonstrated through the modified IEEE 39-bus system simulation. Compared with the boundary-based method, the disclosed method can significantly reduce the measurement requirements with guaranteed inertia estimation accuracy. The time-varying VI of RPGs can be tracked online, indicating that the behind-the-meter feature can be extracted from the frequency measurement. The high estimation accuracy is ensured in various system partitioning conditions. Furthermore, the estimated equivalent inter-area line reactance could monitor the system partitioning condition variation in the online fashion.

Technical Implementation of the Exemplary System

Figure 12:
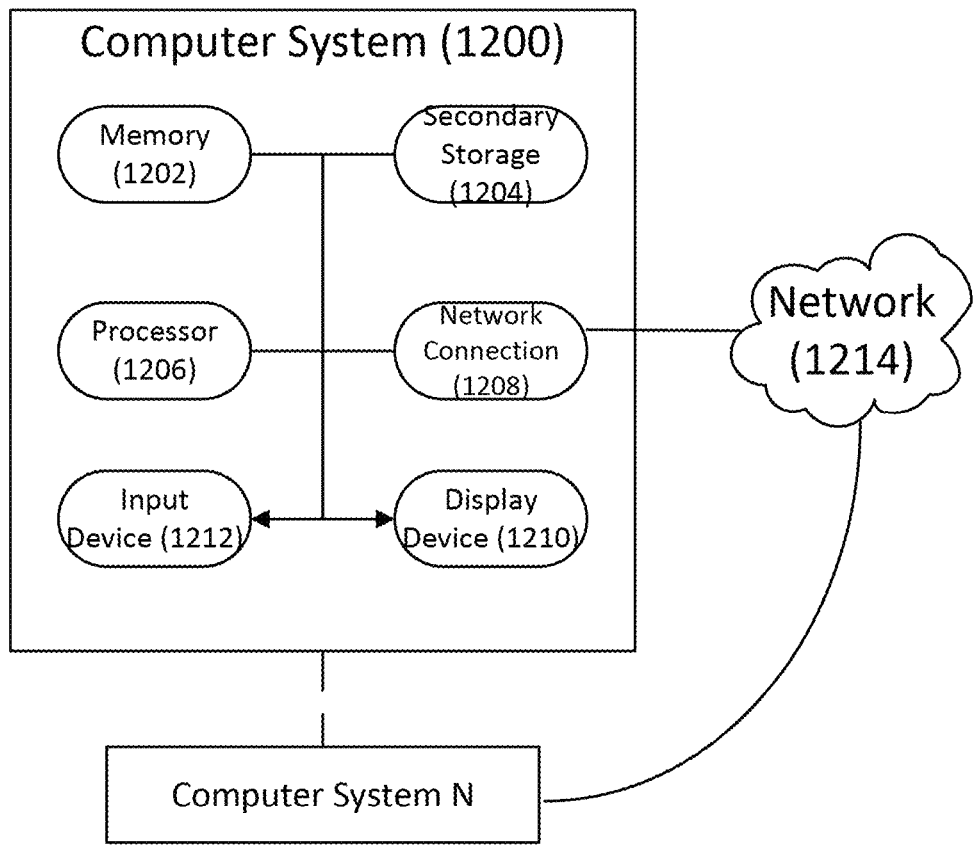
FIG. 12 illustrates exemplary hardware components for a system according to an example embodiment of the present disclosure.

FIG. 12 illustrates exemplary hardware components of an exemplary system. A computer system 1200, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 1200, may run an application (or software) and perform the steps and functionalities described above. Computer system 1200 may connect to a network 1214, e.g., Internet, or other network, to receive inquiries, obtain data, and transmit information and incentives as described above.

The computer system 1200 typically includes a memory 1202, a secondary storage device 1204, and a processor 1206. The computer system 1200 may also include a plurality of processors 1206 and be configured as a plurality of, e.g., bladed servers, or other known server configurations. The computer system 1200 may also include a network connection device 1208, a display device 1210, and an input device 1212.

The memory 1202 may include RAM or similar types of memory, and it may store one or more applications for execution by processor 1206. Secondary storage device 1204 may include a hard disk drive, floppy disk drive, CD-ROM drive, or other types of non-volatile data storage. Processor 1206 executes the application(s), such as those described herein, which are stored in memory 1202 or secondary storage 1204, or received from the Internet or other network 1214. The processing by processor 1206 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 1200 may store one or more database structures in the secondary storage 1204, for example, for storing and maintaining the information necessary to perform the above-described functions. Alternatively, such information may be in storage devices separate from these components.

Also, as noted, processor 1206 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 1200.

The input device 1212 may include any device for entering information into the computer system 1200, such as a touch-screen, keyboard, mouse, cursor-control device, microphone, digital camera, video recorder or camcorder. The input and output device 1212 may be used to enter information into GUIs during performance of the methods described above. The display device 1210 may include any type of device for presenting visual information such as, for example, a computer monitor or flat-screen display (or mobile device screen). The display device 1210 may display the GUIs and/or output from sub-system components (or software).

Examples of the computer system 1200 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1200 is shown in detail, system 1200 may use multiple computer systems or servers as necessary or desired to support the users and may also use back-up or redundant servers to prevent network downtime in the event of a failure of a particular server. In addition, although computer system 1200 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1200, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A method for estimating area-level inertia in a power system, comprising:
   partitioning the power system as a multi-area system, wherein:
      a phasor measurement unit ("PMU") is placed at a bus in at least one area of the multi-area system; and
      for an N-th area which contains only one generator and one bus, the PMU placement must be placed at the multi-area system;
   measuring bus frequencies, power flow related data including amplitude and phase angle of bus voltage by the PMUs or SCADA/EMS as follows:

| Measurable Variables | |
|---|---|
| $f_{B,i}$ ($\forall i \in N$) | from PMU |
| $E_{COI,i}^{(ss)}$, $\delta_{COI,i}^{(ss)}$, and $\delta_{COI,i}^{(0)}$ ($\forall i \in N$) | from power flow calculation by SCADA/EMS |
| $U_i^{(ss)}$ and $\theta_i^{(ss)}$ ($\forall i \in N$) | from PMU or SCADA/EMS |
| $f_{COI,i}^{(0)}$ ($\forall i \in N$) | from PMU or SCADA/EMS | specifying data window for inertia estimation during small disturbance situations;
preparing measured frequencies within the data window, wherein:
   for the power flow data, variables at a linearization point correspond to a head of the data window, and variables at a system steady-state are utilized; and
   determining an internal reactance or an inertia of the N-th area according to an identifiability analysis;
estimating the area-level inertia by:

$$\min_{\hat{\Psi}_*} \left( \int_{t^0}^{t^0+T} \sum_{i \in N} (\hat{f}_{B,i}(\hat{\Psi}) - f_{B,i})^2 dt \right), \quad (11a)$$

$$\hat{\Psi} = \{\hat{H}_{A,i}, \hat{X}_{A,i}, \hat{X}_{L,ij}\}, \tag{11b}$$

$$\hat{f}_{B,i} = g(\hat{\Psi}, f_{COI,i}^{(0)}, \delta_{COI,i}^{(0)}, E_{COI,i}^{(ss)}, \delta_{COI,i}^{(ss)}, U_i^{(ss)}, \theta_i^{(ss)}), \tag{11c}$$

wherein $t^0$ is a moment corresponding to a linearization point; T is a data window length; a vector $\hat{\Psi}$ consisting of parameters to be estimated in (11b); based on $\hat{\Psi}$ and power flow related variables, bus frequency dynamics are estimated in (11c);

wherein $g(\bullet)$ denotes:

$$2H_{A,i}\frac{d\Delta f_{COI,i}}{dt} = -\Delta P_{A,i}^E, \tag{7a}$$

$$\frac{d\Delta\delta_{COI,i}}{dt} = f_N \Delta f_{COI,i}, \tag{7b}$$

$$\Delta P_{A,i}^E = K_{A,i}(\Delta\delta_{COI,i} - \Delta\theta_i), \tag{7c}$$

$$K_{A,i} = \frac{E_{COI,i}^{(ss)} U_i^{(ss)}}{X_{A,i}}\cos(\delta_{COI,i}^{(ss)} - \theta_i^{(ss)}) \tag{7d}$$

$$\frac{d\Delta\theta_i}{dt} = f_N \Delta f_{B,i}. \tag{8}$$

$$\Delta P_{A,i}^E = \sum_{j\in N, j\neq i} K_{L,ij}(\Delta\theta_i - \Delta\theta_j), \tag{9a}$$

$$K_{L,ij} = \frac{U_i^{(ss)} U_j^{(ss)}}{X_{ij}}\cos(\theta_i^{(ss)} - \theta_j^{(ss)}), \tag{9b}$$

where $K_{A,i}$ is a linearization coefficient of a generator active power; the superscript $\{\bullet\}^{(ss)}$ denotes a steady-state value; and where $K_{A,i}$ is a linearization coefficient of an inter-area active power;

obtaining an area equivalent internal reactance and an equivalent inter-area line reactance;

determining a real-time frequency stability level and a real-time degree of frequency spatial distribution based on the area equivalent internal reactance and the equivalent inter-area line reactance;

issuing an alarm in the event of a determined frequency instability; and when an online inertia level is low, allocating optimal inertia from battery storage and unit commitment optimization of synchronous generators;

wherein:

$$\frac{d\Delta\theta_i}{dt} = f_N \Delta f_{B,i}. \tag{8}$$

transient processes of variables in (7)-(9) are determined by the initial conditions of state variables $f_{COI,i}$, $\delta_{COI,i}$, and $\theta_i$;

in (7a) and (7b), the initial conditions of the state variables $f_{COI,i}$, $\delta_{COI,i}$ are their values at linearization points:

$$f_{COI,i}^{init} = f_{COI,i}^{(0)}, \tag{10a}$$

$$\delta_{COI,i}^{init} = \delta_{COI,i}^{(0)}. \tag{10b}$$

$\theta_i$ in (8) is a dependent variable of the state variables.

* * * * *